United States Patent [19]

Caneschi et al.

[11] Patent Number: 4,571,634
[45] Date of Patent: Feb. 18, 1986

[54] DIGITAL IMAGE INFORMATION COMPRESSION AND DECOMPRESSION METHOD AND APPARATUS

[75] Inventors: Mario Caneschi, Siena; Giorgio Tadini, Turin, both of Italy

[73] Assignee: Ing. C. Olivetti & C., S.p.A., Ivrea, Italy

[21] Appl. No.: 473,966

[22] Filed: Mar. 10, 1983

[30] Foreign Application Priority Data

Mar. 19, 1982 [IT] Italy ................ 67351 A/82

[51] Int. Cl.⁴ .......................... H04N 1/00
[52] U.S. Cl. .................. 358/261; 358/260
[58] Field of Search ................ 358/260, 261

[56] References Cited

U.S. PATENT DOCUMENTS

| | | | |
|---|---|---|---|
| 4,212,036 | 7/1980 | Nakagome et al. | 358/261 |
| 4,245,257 | 1/1981 | Yamazaki et al. | 358/260 |
| 4,312,018 | 1/1982 | Nakajiri | 358/261 |
| 4,420,771 | 12/1983 | Pirsch | 358/261 |
| 4,441,208 | 4/1984 | Vida | 358/261 |

Primary Examiner—Howard W. Britton
Assistant Examiner—John K. Peng
Attorney, Agent, or Firm—Banner, Birch, McKie & Beckett

[57] ABSTRACT

One-dimensional compression is effected by addressing a first ROM (62) with information in respect of the length and the type of run. One-dimensional decompression is effected by addressing with the compressed code, a second ROM, bearing the information in respect of the runs and the length of the code. That is provided by a shift register controlled by a logic unit capable of recognising a group of least significant bits, to permit additional shifting of the register, and addressing of the second ROM with a bit number less than the maximum length of the codes. For two-dimensional compression or decompression, there is provided a pair of RAMs for temporarily storing a reference line which, together with the current line, actuates a logic means (38), for controlling coding and decoding of the latter. For compression of the medium tones, besides the runs of the two colors, coding is effect in respect of the runs of the alternations of the two colors defined on the basis of the color of the initial pixel, and the type of the successive run is defined. Besides the coding and decoding for two-color images, the two ROMs also carry the coding and decoding for images with the half tone. Finally, the apparatus comprises an archive memory which can be connected to the compression module for archival storage of the images with the maximum degree of compression. By instead connecting the decompression module between the archive memory and the compression module, the image can be transmitted with a type of compression compatible with the receiving station.

29 Claims, 13 Drawing Figures

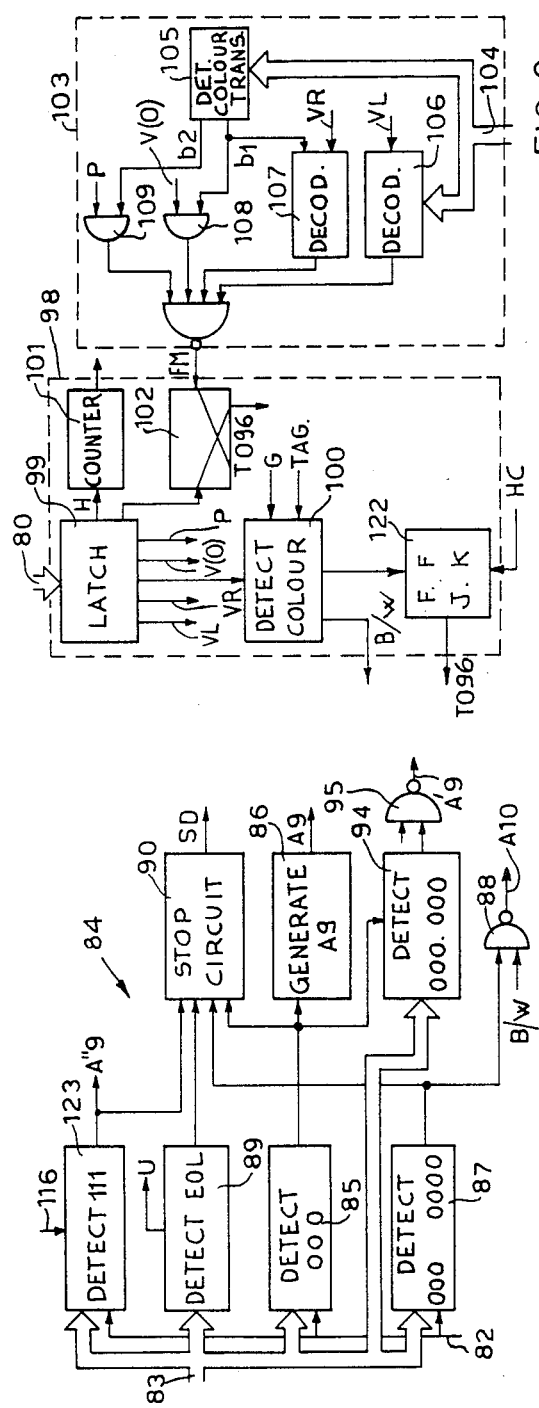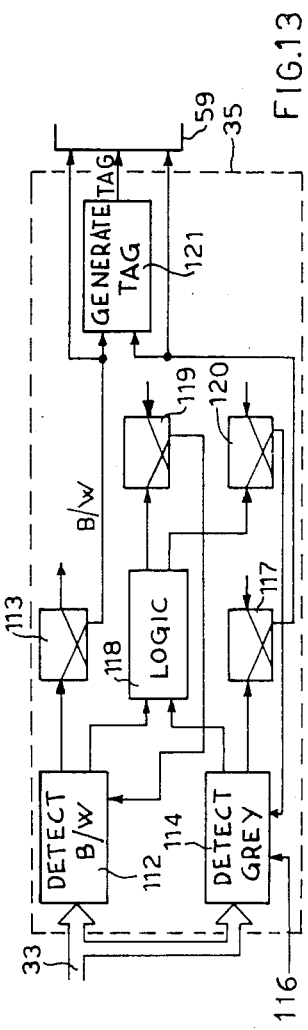
FIG.9
FIG.13
FIG.8

1

DIGITAL IMAGE INFORMATION COMPRESSION AND DECOMPRESSION METHOD AND APPARATUS

BACKGROUND OF THE INVENTION

The present invention relates to a digital image information compression and decompression apparatus wherein a succession, or a run of a given length, of pixels of the same type is compressed by addressing a first read only memory (ROM) which carries the binary one-dimensional compression codes, and in which these codes are decompressed by addressing a second read only memory (ROM) which carries the corresponding information in respect of the type of pixel and the run length.

Compression and decompression apparatuses, either of one-dimensional type or of two-dimensional type, are known, As is known, for the two-dimensional type, in coding an elementary line which is read by the scanning unit, account is taken of a previously read reference line.

In the known apparatuses, processing of the images using the two-dimensional method is effected by means of complicated equipment which requires software or programs which take a relatively long time to execute. An apparatus has been proposed, for one-dimensional compression and decompression which is effected in the hardware. However, two-dimensional coding cannot be effected therein, so that the degree of compression is limited.

SUMMARY OF THE INVENTION

The object of the present invention is to provide an apparatus in which both one-dimensional compression and decompression and two-dimensional compression and decompression are effected at enhanced speed and with enhanced efficiency.

The apparatus according to the invention is characterised by means for temporarily storing the information in respect of a preceding line for actuating the control means co-operating with the first and second memories in such a way as to control two-dimensional compression and decompression of the information.

In accordance with another characteristic of the invention, the second memory is addressed by a shift register and is provided with a number of inputs that is less than the maximum bit number of the code, logic means being provided for recognising a group of least significant bits of the code for replacing them by a smaller number of address bits.

In accordance with a further characteristic of the invention, for compression of the medium tones formed by an alternation of pixels of the two colours, coding is effected separately in respect of a first medium-tone run which begins with a colour and a second medium-tone run which begins with the other colour, whereby there are four different types of run.

BRIEF DESCRIPTION OF THE DRAWINGS

The invention will now be described in more detail, by way of example, with reference to the accompanying drawings, in which:

FIGS. 8 and 9 are two detailed diagrammatic views of some blocks shown in FIG. 6, FIG. 13 shows a detailed diagrammatic view of a module in FIG. 3 for coding the medium tones.

DESCRIPTION OF THE PREFERRED EMBODIMENT

Figure 1:
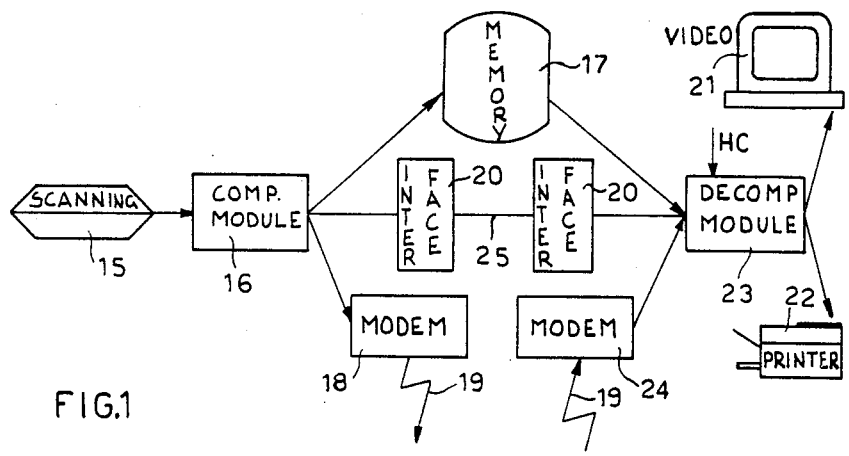
FIG. 1 shows a diagram of a digital image information compression and decompression apparatus in accordance with the invention.

The document facsimile processing apparatus essentially comprises an input unit formed by a device 15 for optically scanning the document, which is arranged to generate binary signals corresponding to the individual elements of the images read, hereinafter referred to as pixels. The binary signals which are generated in that way are coded and compressed in a compression module 16 from which they can be selectively passed either to a mass or archive memory 17 for future use or, by way of a modem 18, to a transmission line 19 for a remote station.

The apparatus further comprises one or more output units which may be a video unit 21 or a high-definition dot-type printer 22, for example a laser printer. The output unit is controlled by a decompression module 23 which is arranged to receive the compressed signals from the memory 17 or from a remote station by way of the line 19 and a modem 24. Finally, the compression module 16 may be locally connected directly to the decompression module by way of two interface units 20 and a connecting cable 25.

The apparatus is particularly adapted to operate in accordance with the standards set by the CCITT for the facsimile transmission in group G3, whereby a sheet of A4 size is to be transmitted over a telephone line in about one minute. The proposed standard T4 in regard to such transmissions provides that the document is read in successive elementary lines, each being read from left to right with a definition of 1728 pixels over a line of 215 mm, that is to say, with a definition of 8 pixels/mm.

Black and white (B/W) coding is effected by coding the length of sequences of the pixels or run of the same colour. That can be effected by using two separate compression methods.

The first method, which is referred to as one-dimensional compression, comprises reading only one elementary line at a time and allotting the Huffman codes prescribed by proposed standard T4 to the various black pixel and white pixel runs. Those codes are represented by words of variable length of from 2 to 13 bits, such that no code may represent the least significant part of another code.

In particular, in accordance with that code, runs of a length of from 0 to 63 pixels are represented by corresponding code words which are referred to as the terminating code or TC, while the sequences of multiples of 64 pixels, that is to say 64, 128 ... 1728, are represented by other code words and are referred to as make-up or MK codes. Therefore, runs larger than 63 pixels require two code words, an MK and a TC.

Also provided is an extension of the common MK codes for black runs and white runs, which are multiples of 64 greater than 1728. Those common codes are of a length of 12 or 13 bits and seven most significant bits all at zero.

The white codes from 0 to 63 are of a maximum length of 8 bits, while the white MK codes are of a length of up to 9 bits.

In contrast, the black TC codes from 0 to 63 are of a length of up to 12 bits and the black MK codes are of a length of up to 13 bits. In addition, the black TC codes from 7 to 63 and all the black MK codes have at least the three most signficant bits equal to zero, while the black TC codes from 1 to 6 have at least a 1 in the first three least significant bits.

Finally, the MK codes of the black runs from 320 to 1728, between which are contained all those of thirteen bits, always have the six least significant bits equal to zero.

The second compression method, referred to as two-dimensional compression, comprises first defining the pixels b1 and b2 of a previously read elementary line, referred to as reference line R (see FIG. 2), in which a white run or a black run begins in that line. The method then comprises defining the length of the runs of the black line which is actually being read, referred to as the current line C, from the initial run pixels a0, a1, a2 of that line, in dependence on the pixels b1 and b2 of the reference line, thereby achieving a greater degree of compression.

In particular, the following situations are defined, being designated by corresponding mode codes:

Pass mode (P) if b2 is to the left of a1 (see FIG. 2a), in which case the pixel a'0 below b2 is defined as a fresh pixel a0;

horizontal mode (H) if a1 is spaced from b1 by more than 3 pixels, that is to say, a1 b1>3 (see FIG. 2b);

vertical mode if a1 is spaced from b1 by not more than 3 pixels (a1 b1≦3); in particular, the mode is referred to as V(O) if a1 is below b1, VR(Vertical Right) followed by the number indicating the pixels a1 b1 if a1 is to the right of b1 (see FIG. 2c), and VL(Vertical Left) followed by the number of pixels a1 b1 if a1 is to the left of b1.

The associated mode codes are given by the following table 1 wherein the codes H expressed by M(a0 a1) and M(a1 a2) are the respective one-dimensional codes:

TABLE 1

| Mode | Code |
| --- | --- |
| P | 0001 |
| H | 001 + M(aoal) + M(ala2) |
| V(0) | 1 |
| VR(1) | 011 |
| VR(2) | 000011 |
| VR(3) | 0000011 |
| VL(1) | 010 |
| VL(2) | 000010 |
| VL(3) | 0000010 |

That coding takes place in two phases: in the first, it is established if a mode P is involved, while in the second it is established if a1 b1 is >0 and <3.

It should be noted that the codes of above-indicated Table 1 are of Huffman type as between themselves, but not with the one-dimensional codes. It should also be noted that normally scanning of a document is effected by alternating a line which is coded with the one-dimensional method, with K-1 lines coded by the two-dimensional method, wherein K indicates the number of lines of a cycle and represents a parameter indicating the vertical resolution of the reading operation. Normally, K=2 for standard resolution of 3.75 pixels/mm and K=4 for better resolution.

To indicate the beginning of the first run of a line, the device 15 (FIG. 1) generates a white imaginary pixel a0 to the left of the actual beginning of the line. To indicate the end of a line, the device 15 generates an end-of-line code EOL.

COMPRESSION MODULE

Figure 3:
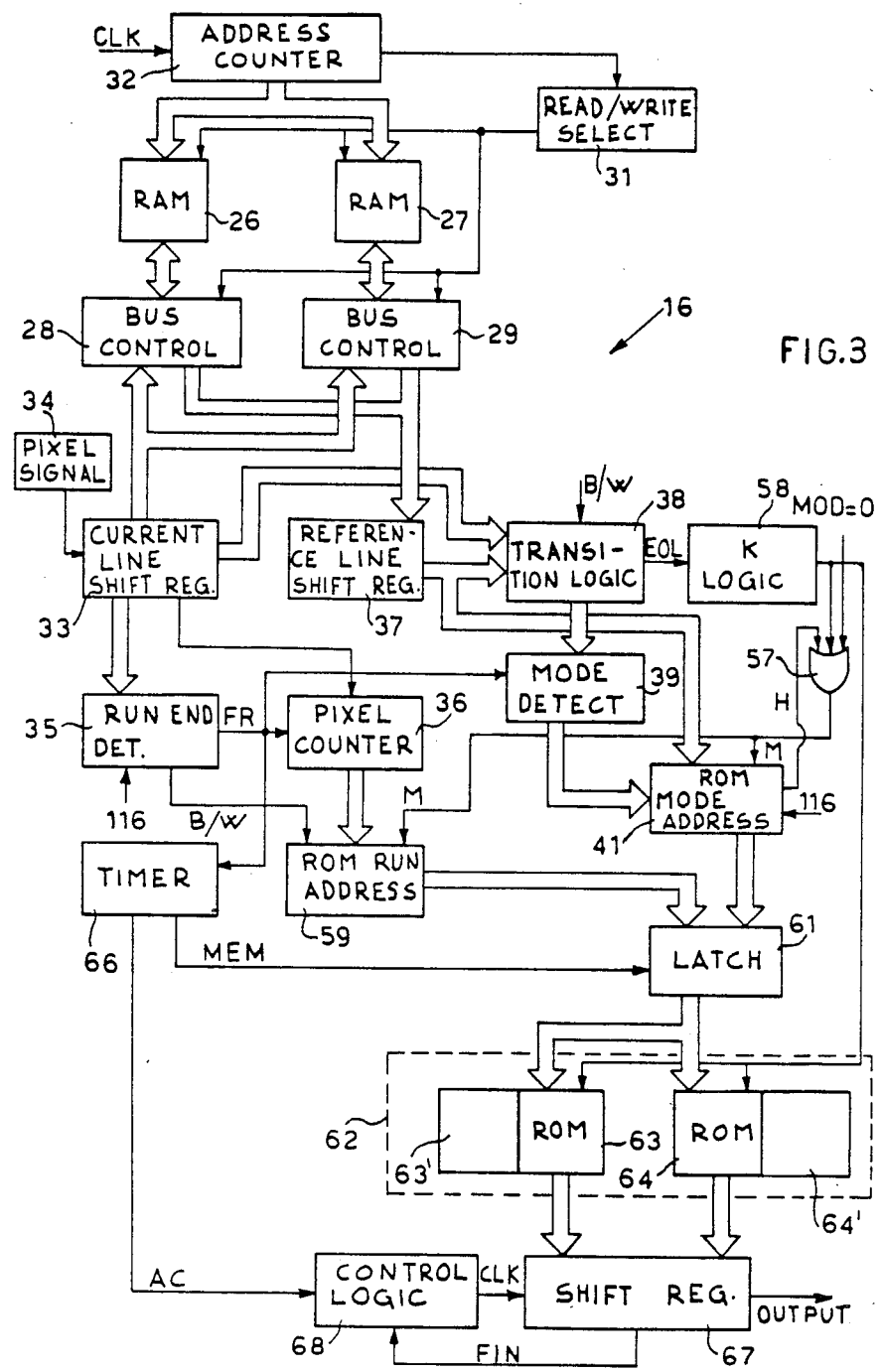
FIG. 3 is a block diagram of the compression module of the apparatus.

The compression module 16 comprises two reading and writing random access memories (RAM) 26 and 27 (see FIG. 3), each being capable of temporarily storing a line of pixels. By way of example, each memory 26 and 27 may comprise a 1K×4 bit RAM. Alternatively, the two memories 26 and 27 may be formed by the two halves of a single 2K×4 bit RAM. In both cases, each RAM 26 and 27 has the capacity to store the maximum length of line prescribed by the proposed standard, up to 2623 pixels. Each RAM 26 and 27 is controlled by a corresponding bus control circuit 28 and 29 in such a way as to establish the direction of information flow, that is to way, whether the respective RAM 26, 27 is in the reading or writing mode. The two control circuits 28 and 29 are controlled by a read-write select circuit 31 comprising a flip-flop which is switched over at the end of each line.

The two control circuits 28 and 29 are so arranged as to effect writing of one of the two RAMs 26 and 27 simultaneously with reading of the other RAM. Therefore, the operation of reading a reference line is effected from one of the two memories 26 and 27 at the same time as the current line is written in the other memory 26, 27.

The two memories 26 and 27 are addressed by an address counter 32 which, at the end of the operation of scanning each elementary line, is automatically loaded in parallel with a value depending on the number of pixels in the line, that is to say, the width of the document. It is decremented during the operation of scanning the line by an input clock CLK and, when it reaches zero, it switches over the circuit 31.

The inputs of the two control circuits 28 and 29 are connected to the output in parallel of a first shift circuit 33. The circuit 33 serially receives the bits produced by a circuit 34 for defining the signals corresponding to the pixels which are read in the current line, which is included in the scanning unit 15 (see FIG. 1). The circuit 33 (see FIG. 3) comprises a shift register through which the bits of the current line pass and a latch circuit which staticises those bits in groups of four to pass them in parallel to the circuits 28 and 29. The register in the circuit 33 is also connected to a logic circuit 35 for examining a sequence of at least three bits to detect the end of each run, producing a signal FR at one of its outputs. The circuit 35 is also arranged to indicate the current colour with a staticised signal on an output B/W which is at 0 to indicate black and at 1 to indicate white. The FR signal output is connected to a counter 36 which is arranged to be set to zero by each signal FR and to count the pixels of the same colour, which are received by the circuit 33 after each run end.

In contrast, the output of the two circuits 28 and 29 is connected to the input in parallel of a second shift circuit 37. The circuit 37 is arranged to receive from the memories 26 and 27, the bits of the reference line, in parallel in groups of four, to apply them to a logic circuit 38. The circuit 38 at the same time receives the bits which pass through the circuit 33. The circuit 38 essentially comprises EX-OR gates (see FIG. 4) controlled by the signal "B/W" and by the signals coming from the outputs $2a$, $3a$ and $\overline{2a}$ of the shift circuit 33 of the current line and by the signals coming from the outputs $2b$, $3b$ and $4b$ of the shift circuit 37 of the reference line, in order to detect all the transitions 0→1 and 1→0 on the current line and on the reference line. The various configurations of such signals are recognised by a logic circuit 39 (see FIG. 3) for detecting the type of mode for two-dimensional compression. The circuit 39 is arranged to condition a circuit 41 for forming the address for producing the associated mode code. The circuit 39 is also controlled by the signal FR produced by the circuit 35.

Figure 2:
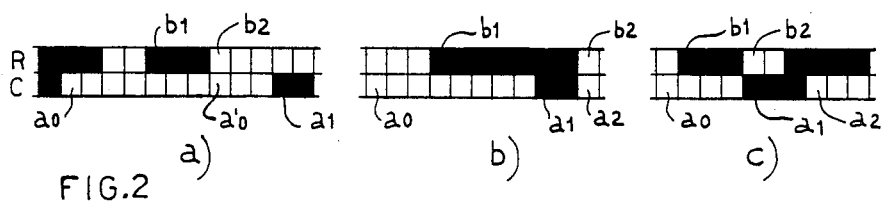
FIGS. 2a, 2b and 2c are diagrams illustrating two-dimensional coding.

In particular, the circuit 39 comprises a group of three flip-flops 42, 43 and 44 (see FIG. 4) which can be activated when the circuit 38 respectively detects the transitions $\overline{b1}$, $\overline{b2}$ and $\overline{a1}$ (see FIG. 2). The flip-flops 42, 43 and 44 (see FIG. 4) give the corresponding signals and the associated inverted values b1, b2 and a1. A fourth flip-flop 46 connected to the circuit 33 (see FIG. 3) is arranged to store the colour of the bit a0 (that is to say, the last bit of the current line, as considered upon individualisation of the various modes). Such colour is white when the flip-flop 46 is set and black when it is reset, and conditions recognition of the mode subsequent to the one detected.

Figure 4:
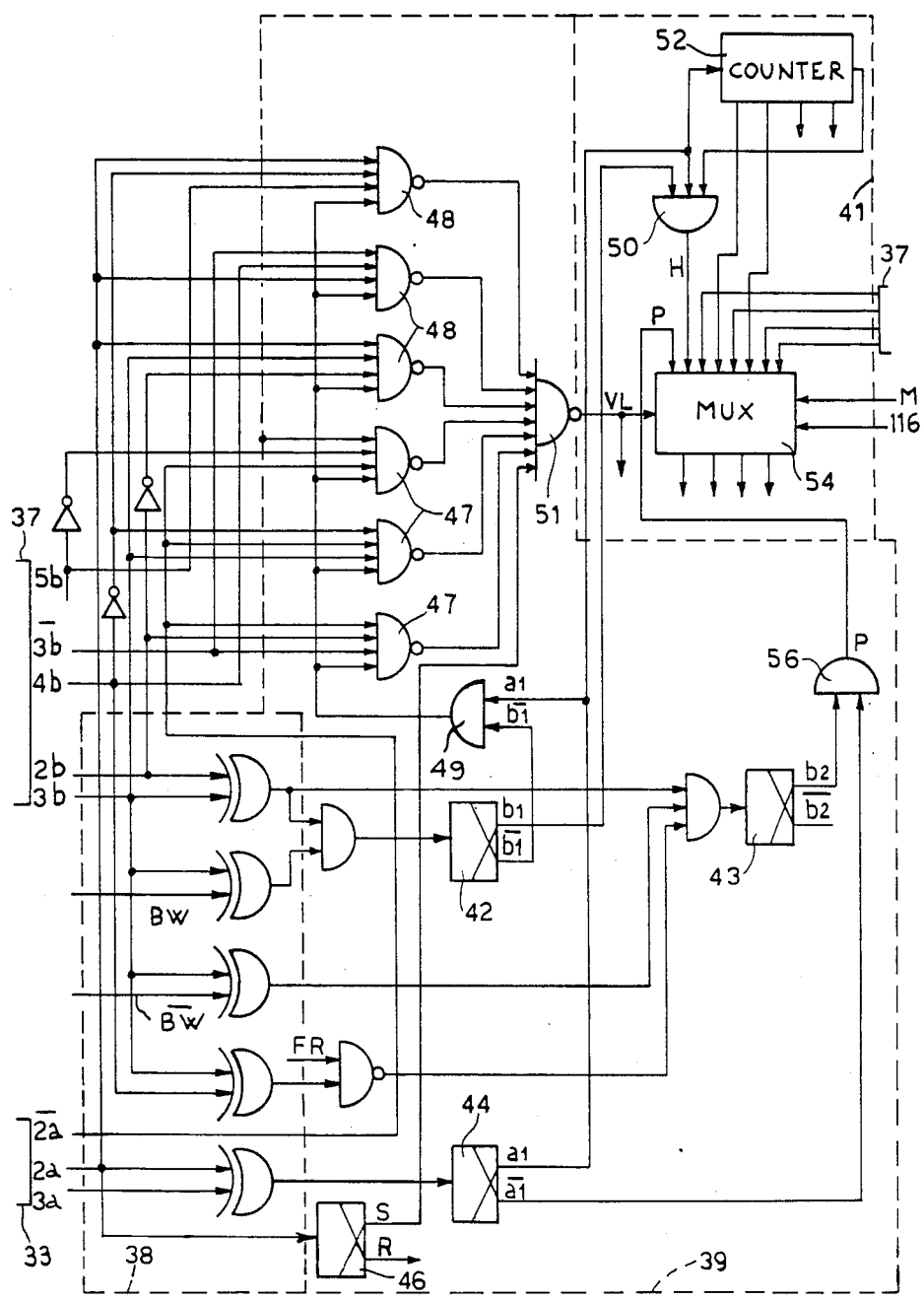
FIG. 4 is a detailed view of some blocks shown in FIG. 3.

The circuit 39 also comprises two groups of three NAND gates 47 and 48 which are controlled by the signals issuing from the outputs of the serializing circuits 33 and 37 indicated in FIG. 4, the signal from an AND gate 49. Therefore, when a1 is present, the NAND gates 47 and 48 recognise the various bit configurations which determine the VL.

When any one of the NAND gates 47 and 48 is activated in combination with the signal of the flip-flop 46 indicating whether there is a0 black or a0 white, it outputs at another NAND gate 51 a signal VL which is applied to the circuit 41. That circuit essentially comprises a counter 52 which is enabled to count up to 3 by setting to b1 of the flip-flop 42 and a multiplexer 54 (MUX) which is arranged to output an address corresponding to the two-dimensional compression mode.

In particular, the signal VL from the gate 51 enables the multiplexer 54 to give, in response to the information from the register 37, the address corresponding to three vertical modes: V(O), VL, VR. If the flip-flop 42 is set to b1 before the flip-flop 44 is set to a1, the AND gate 49 disables the NAND gates 47 and 48, whereby the items of information coming from the counter 52 when it is set to a1, which give the number of bits a1 b1 are enabled in the multiplexer 54. If however the flip-flop 43 is also set to b2 before a1, the AND gate 56 enables the multiplexer 54 to produce the mode P address. If a1 is set before b1 and the counter 52 has a configuration 0 or a configuration from 1 to 3, it conditions the multiplexer 54 to emit the mode V(O) address, or the address of one of the three VR modes respectively. If however, with a1 before b2, the counter 52 exceeds its capacity, the associated signal by way of an AND gate 50 enables the multiplexer to produce the mode H address. The circuits 39 and 41 are reset on each occasion, after the address given by the multiplexer is used. The production of that address however is inhibited by a signal M issued by an OR gate 57 (see FIG. 3) either in the case of one dimensional functioning i.e. if it is MOD=0 or in the case of forming a pair of addresses after using the mode H address represented by the signal H in FIG. 3.

The signal M is produced by a logic means 58 for varying the parameter K of two-dimensional compression. The logic means 58 essentially comprises a counter which can be set to a state, according to the parameter K. The counter is then incremented by the end-of-line signals EOL and, when it exceeds its capacity, by way of the OR gate 57, it generates the zeroing signal M. Finally, the logic means 58 is arranged to recognise in known manner the sequence of codes which indicate the end of the page, as provided by the standards of the scanning unit 15.

The signal M is arranged to enable a multiplexer 59 (see FIG. 3) to produce an address corresponding to the value reached by the counter 36 at the end of the corresponding run. In particular, the multiplexer 59 is operative to form a code TC if the counter 36 has counted a number of bits <64. In the opposite case, it accumulates in a counter the number of integral multiples of 64, on the basis of which it first produces the code MK, and it then produces the code TC corresponding to the number of bits exceeding that multiple.

The addresses issued by the multiplexer 59 and the circuit 41 are staticised from time to time by a latch circuit 61 which is operative to maintain it constant during a predetermined period required to access a read only memory 62 in such a way as to permit the logic means which precedes it to develop for the subsequent address.

Figure 5:
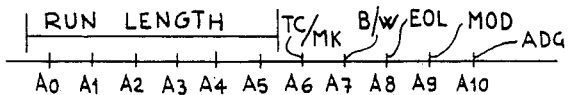
FIG. 5 is a diagram of the address of the ROM of the compression module.

The ROM 62 is recorded with the Huffman codes and may have a capacity of 1K×16 bits, whereby it may be formed by two standard chips 63 and 64, each with a capacity of 1K byte, which are addressed in a parallel mode. In particular, the memory 62 is addressed by the latch circuit 61 which a 10 bit address, as illustrated in FIG. 5. It comprises six bits A0-5 relating to the length of the run, a bit A6 which specifies if it is a code TC or a code MK, a bit A7 which specifies if white or black pixels are involved, a bit A8 which specifies if end-of-line is involved, and a bit A9 which specifies if a mode code (MOD=1) or one-dimensional coding (MOD=0) is involved. The overflow from the counter of the logic means 58 (FIG. 3) adds to the code EOL applied to the memories 63 and 64 by the latch 61, a bit=0 which indicates that the subsequent line will be coded using the one-dimensional method, while for the other K−1 lines, the bit added to the end-of-line code is 1.

The compression module 16 further comprises a timing circuit or timer 66 which is controlled by each signal FR produced by the circuit 35, and which is capable of outputting a first signal MEM for enabling the latch 61 to staticise the address and a second signal AC which has a delay relative to the first, equal to the access time of the memory 62. The modules 63 and 64 thereof are operative to load in parallel an output shift register 67 under the control of a logic circuit 68 enabled by the signal AC. The circuit 68 also generates a clock signal for controlling the serial output of the code loaded from time to time into the register 67. After output of the last bit of the code, the length of which is known to be variable, the register 67 produces a signal FIN to signal to circuit 68 the end of the output of the code.

In the situation of one-dimensional operation, the signal MOD=0, by way of the OR gate 57, inhibits the circuit 41, whereby all the logic means relating to the comparison with the reference line, comprising the blocks from 26 to 32 and 37 to 39 remain excluded from operation. The signal M from the OR gate 57 however enables the multiplexer 59. Therefore, the bits coming in series mode from the circuit 34 reach the circuit 33 and pass from that to the circuit 35 in which the colour transitions are recognised. Starting from the end of each run, the staticised signal FR enables the counter 36 to compute the length of the current run. If that computation is less than 64, the multiplexer 59 applies to the latch 61 only the address of the memory 62 relating to the code TC of the corresponding number of bits. That code will have the bit A6=0 and the bit A9=0 (see also FIG. 5).

Under the control of the circuit 68, that code is now loaded in parallel in the register 67, from which it is read serially for storage in the memory 17 (see FIG. 1), or to the interface unit 20 or to the modem 18 for transmission.

If however the count of the bits in the run is higher than 64, the multiplexer 59 (see FIG. 3) produces two addresses in succession. The first address which will have bit A6=1 identifies the code MK at the memory 62 while the second address which will have bit A6=0 identifies the code TC. In both cases, the bit A9 is equal to zero. The two codes produced by the memory 62 on the basis of the two addresses are then issued in succession by the register 67 in a similar manner to the procedure described above.

When dealing with two-dimensional compression, the factor K is suitably set in the counter of the logic means 58, while the signal MOD=0 at the input of the OR gate 57 goes false. In that case, the runs of each elementary line are copied alternately at the two memories 26 and 27 under the control of the counter 32 and the circuit 31.

Obviously, since during the operation of reading the first line, the logic means 58 is in the overflow condition, the OR gate 57 inhibits the circuit 41 and activates the multiplexer 59. Therefore, the runs of the first line are coded by the ROM 62 under the control of the multiplexer 59 in accordance with the one-dimensional compression method. The same occurs during the operation of reading the subsequent lines, in which the logic means 58 repeats its overflow condition, whereby it will be clear that, in two-dimensional compression, a line is periodically coded using the one-dimensional compression method.

During reading of the other lines however, the bits of the current line which are produced by the circuit 33 are processed by the circuit 38 together with the bits of the reference line which are produced by the circuit 37 to permit the circuit 39 to detect the type of mode of each run. If the circuit 39, by way of the AND gate 50 (see FIG. 4), detects the mode H, it will cause the multiplexer 54 of the circuit 41 to generate the associated address for extracting the corresponding code 001 from the ROM 62 (see FIG. 3). The signal H is of a duration such that, by way of the OR gate 57, the multiplexer 59 is permitted to address the ROM 62 for coding two subsequent runs a0 a1 and a1 a2, in accordance with one-dimensional coding.

Similarly, if the circuit 39, by way of the AND gate 56 (see FIG. 4), detects the mode P, it causes the multiplexer 54 of the circuit 41 to generate the associated address for extracting the corresponding code 0001 from the ROM 62 (see FIG. 3), whereby the flip-flop 46 now defines the code of the pixel a'0 of the current line, which is aligned with b2. After that coding operation, the circuit 39 re-examines the situation for subsequently detecting the type of mode.

Finally, when the circuit 39, by way of the NAND gates 47, 48 and 51 (see FIG. 4) and the flip-flops 42-46, detects a mode V(O), VL or VR, in combination with the value supplied by the counter 52, it addresses the multiplexer 54 in such a way as to output the address in the ROM 62 of the corresponding mode V(O), VR(1-3) or VL(1-3).

The ROM 62 then directly supplies the register 67 with the corresponding code indicated in Table I.

DECOMPRESSION MODULE

The decompression module 23 (see FIG. 1) also comprises two random access memories 71 and 72 (RAM) (FIG. 6) addressed by an address counter 73 and controlled by two bus control circuits 74 and 76 which in turn are controlled by a read-write select circuit 77.

Since those components are entirely similar to the corresponding components 26-32 (see FIG. 3) of the compression module, there is no need for the detailed description thereof to be repeated here.

The decompression module 23 (see FIG. 6) essentially comprises a read only memory 75 in which are recorded the runs of bits corresponding to the Huffman codes. Since those codes may be of a length of up to 13 bits, whenever a 14th white/black bit is added to the address, it would be necessary to have two 8K×8 bit ROMs for the white codes and another two 8K×8 bit ROMs for the black codes to permit unequivocal addressing.

According to the invention however, it is possible to use two ROM modules 78 and 79 which each have a capacity of 2K×8 bits, which are addressed with a word of 11 bits which are referred to hereinafter as A0-A10, in accordance with the diagram shown in FIG. 7. The ROM 78 contains a series of words of six bits (0-5), which give a length of the run associated with the code addressed, and a bit T which, if it is 1, indicates a code TC, while if it is 0, it indicates a code MK.

At its four outputs, the ROM 79 gives the information relating to the length of the one-dimensional code, that is to say, the number of bits forming that code. In particular, for reasons which will be apparent hereinafter, for the codes of the white runs and for the codes of the black runs which are less than seven pixels, the ROM 79 gives the effective length of the code, which is always less than nine. However for black runs which are greater than or equal to seven pixels, which have the three least significant bits equal to zero, the ROM 79 gives the length of the code increased by three. The four outputs 0-3 of the ROM 79 are connected to a multiplexer (MUX-latch) 81 (see FIG. 6) which loads the corresponding bits into a counter 82. The ROM 79 also produces at three outputs 1, 2, 3 the mode codes which are applied to a mode decoder 80. The codes are also applied to the MUX-latch 81 where they give the length of the mode code. The second input of the MUX-latch 81 is enabled by a signal MOD=1 produced by the decoder 80 to indicate whether a mode code is involved.

The address of the ROMs 78 and 79 is provided in part by a twelve bit shift register 83 which is operative to receive in series the bits of the codes from the memory 17 (FIG. 1) or the interface unit 20 or the receiving modem 24. The register 83 (see FIG. 6) is connected in parallel to a logic input circuit 84 having mainly the function of controlling addressing and reading of the ROMs 78 and 79 and shifting of the register 83 under the control of the counter 82.

In particular, the logic circuit 84 comprises a circuit 85 (see FIG. 8) for recognising a run code in which the three least significant bits are zero. That involves a black run of greater than six and the circuit 85 enables a circuit 94 to examine the subsequent three bits of the register 83 to establish if they are also three zeros, that is to say, if the black run is greater than 320. In addition, the circuit 85 is operative to condition a circuit 86 to generate a bit A9=0 if there is at least one bit =1 in the three least significant bits of the code, or a bit A9=1 if the above-mentioned three bits are equal to zero. The bit A9=0 always constitutes the tenth bit of the address of the ROMs 78 and 79. The bit A9=1 however constitutes the tenth address bit only if the circuit 94 recognises at least one 1 in the three subsequent bits of the code. In that case, the black run code is properly defined even without taking account of the three least significant bits.

If however the circuit 94 recognises three subsequent bits equal to zero, it produces at a NAND gate 95 the thirteenth bit, that is to say, the most significant bit of the code for the black run which is greater than 512 produced by the counter 83 which would otherwise be lost, outputting the signal A'9. The output of the NAND gate 95 representing such most significant bits is now used as the tenth bit of the memories 78 and 79 (FIG. 7) whereby in that case also the code remains perfectly well defined.

Figure 7:
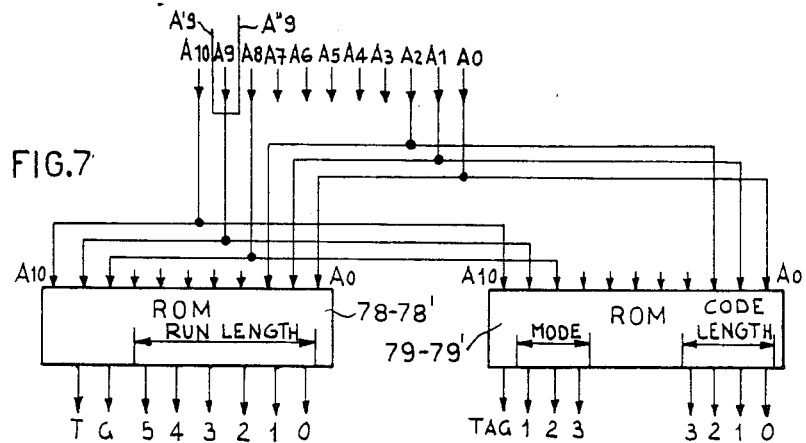
FIG. 7 is a diagram of the address of the ROM of the decompression module.

In addition, the logic circuit 84 comprises a circuit 87 (see FIG. 8) which is capable of recognising the run codes in which the seven least significant bits are zero (MK beyond 178, being common for white and black) to produce at the output of the NAND gate 88 a signal A10=1 of the address of the memories 78 and 79 (see FIG. 7). A circuit 89 (see FIG. 8) of the logic circuit 84 is in turn arranged to recognise the code EOL and to issue a line synchronisation signal U. The circuit 89 also recognises the most significant bit which is additional in the compression process in dependence on the type of coding (one-dimensional or two-dimensional) of the subsequent elementary line. The circuits 85, 87 and 89 are enabled to recognise the three zeros or the seven zeroes by a signal from the counter 82 when it is zeroed.

A stop circuit 90 is controlled in an OR mode by the circuits 85, 87 and 89 to produce a signal SD for blocking the input of the bits to the register 83 for the period of reading the memories 78 and 79 (see FIGS. 6 and 7) when the counter 82 is zeroed.

In particular, the signal SD controls a timing circuit or timer 91 which generates a signal LM for enabling reading of the memories 78 and 79, blocking the shift of the register 83 for a period of time equal to the reading time. The timer 91 also produces a pulse CL for enabling loading in respect of the length of the run supplied by the ROM 78 on six outputs into a latch circuit 92 when the item of data represents a code MK (bit T=0) while in the absence of that pulse CL, it enables loading of the length of the run into a counter 93 when the item of data represents a code TC (bit T=1).

The signal LM from the circuit 91 also simultaneously enables loading of the four bits of length code given by the ROM 79 to the MUX-latch 81 and the three bits of the mode code, to the decoder 80.

The counter 93 also receives the length of the code MK which is staticised by the circuit 92 in such a way as to add together the length of the code MK and the code TC. The counter 93 is operative to enable an output circuit 96 to issue the decompressed bits until, in the decrementing mode, it reaches zero, whereby the circuit 96 issues a number of bits equal to the value of the data initially contained in the counter 93. Those bits are thus passed for use, that is to say, to the video unit 21 (FIG. 1) or the printer 22.

The bits from the circuit 96 (FIG. 6) are also passed to a shift register 97 from which they are passed in parallel in groups of four to the control circuits 74 and 76, in a similar manner to that described above in relation to the circuit 33 (see FIG. 3).

Figure 6:
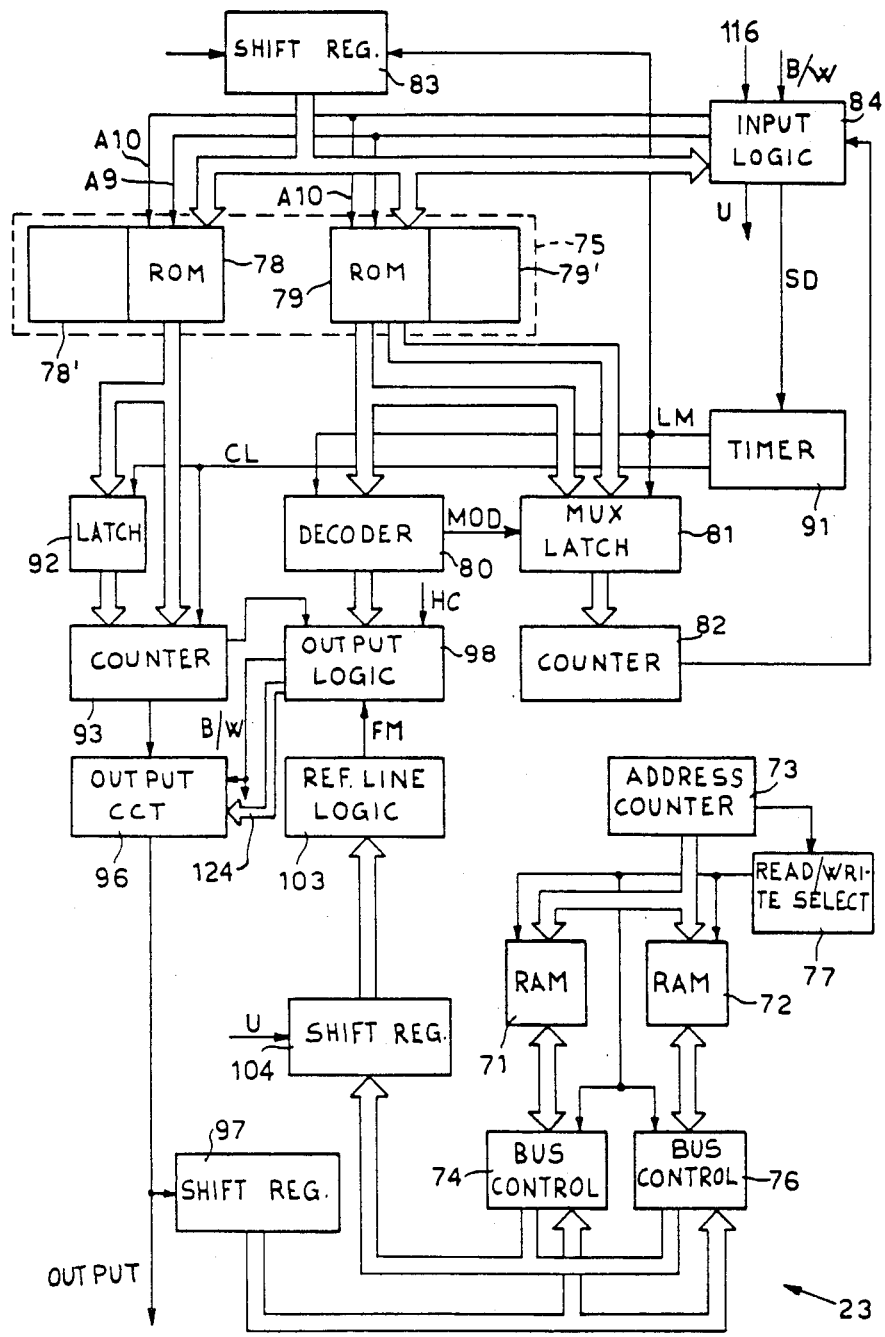
FIG. 6 is a block diagram of the decompression module of the apparatus.

The decoder 80 is connected to a logic circuit 98 which, depending on the decoded mode, controls the output circuit 96. In particular, the circuit 98 comprises a latch circuit 99 (see FIG. 9) of the decoder and is operative to produce the signals corresponding to the various modes P, H, V(O), VL and VR. A circuit 100 is operative to define, in dependence on the succession of the mode codes, the colour of the current run and the colour of the subsequent run. The circuit 100 outputs the signal B/W for controlling the circuit 84 and the circuit 96 (see FIG. 6). In addition, the circuit 98 comprises a counter 101 (see FIG. 9) which can be impressed by the mode H code issued by the latch circuit 99 to control the circuit 96 in such a way as successively to issue the two runs provided by the mode H. Finally, the circuit 98 comprises a flip-flop 102 which can be set by the latch circuit 99 when it recognises the mode codes except for the mode H to condition the circuit 96 for issuing the bits of the run subsequent to the mode code. In FIG. 6, the various connections of the circuit 98 with the circuit 96, excepting the connection B/W are indicated by a multiple bus 124.

The circuit 98 is also connected to another logic circuit 103 (see FIG. 6) which can be conditioned by the bits of the reference line to signal to the circuit 98, by a signal FM, the end of the dispatch of the bits of the current run in the two-dimensional decompression process. The signal FM can therefore reset the flip-flop 102 (see FIG. 9) of the circuit 98.

The bits of the reference line are supplied in series by a shift register 104 (see FIG. 6) connected to the output of the two bus control circuits 74 and 76 associated with the memories 71 and 72, the register 104 being capable of being enabled by the signal U from the circuit 89 (see FIG. 8).

In particular, the circuit 103 comprises a gate circuit 105 (FIG. 9) for recognising the transitions of colour in the reference line whereby it can supply the signals b1 and b2, and a decoding circuit 106 (FIG. 9) for the transition bits of the reference line, which are supplied by the register 104 when the latch circuit 99 produces a mode VL code signal for generating the signal FM. A second decoding circuit 107 generates the same signal FM in dependence on the signal b1 of the reference line, which is supplied by the circuit 105, and the mode VR supplied by the latch circuit 99. An AND gate 108 generates the same signal FM when the latch circuit 99 supplies the mode V(O) and the signal b1 of the reference line is verified. Another AND gate 109 generates the signal FM when the mode P is supplied by the latch circuit 99, when it receives the signal b2 from the reference line.

The bits forming a compressed code serially reach the register 83 (FIG. 6), beginning from the least significant bit, for addressing the memories 78 and 79 (ROM). There is no separation at the input between one code and the subsequent code, whereby the memories 78 and 79 are continuously addressed by the bits A0–A10 (see FIG. 7). In order to recognise the outputs of the individual codes, use is made of the property of Huffman codes, whereby, both in respect of codes in one-dimensional compression, as among each other, and in respect of mode codes in two-dimensional compression, as among each other, no code may be the least significant part of another code, whereby an incomplete code cannot be recognised by the memories 78 and 79.

It will first be assumed for the sake of simplicity that the compressed codes arriving at the register 83 (see FIG. 6) are of one-dimensional type. Shifting of the register 83 continues until the first bit of the code reaches the end of the register 83, in which case a part of the subsequent code will have entered the most significant part of the register 83.

At that time, the memories 78 and 79 will be identified by a set of bits formed in the least significant part of the code under consideration and in the most significant part of the beginning of another code. By virtue of the characteristic that no Huffman code is the least significant part of a code of the same colour, whatever the subsequent code may be, addressing is thus effected in respect of an unequivocally defined area in the memories 78 and 79, that area containing in each eight bit word therein, the information relating to the current code.

At the beginning of each elementary line, the counter 82 is loaded in such as way as to carry the first code of a pixel which is certainly white, to the end of the register 83, while the circuit 100 (see FIG. 9) of the logic circuit 98 is set into a state for the colour white.

The circuit 90 (see FIG. 8) therefore automatically supplies the signal SD which blocks shift of the register 83 (see FIG. 6) and causes the timer 91 to generate the signal LM for reading the ROMs 78 and 79 whereby the code is immediately decoded. In particular, the ROM 78 supplies the bit T (see FIG. 7) associated with the number of decompressed bits representing the code. That number is loaded into the counter 93 (see FIG. 6) which permits the output circuit 96 to issue an equal number of bits of the colour indicated by the circuit 100 (see FIG. 9).

At the same time, the ROM 79 (see FIG. 6) supplies the MUX-latch 81 with the length recorded therein of the code generated by the address, while in the absence of a mode code, where a one-dimensional code is involved, the decoder 80 receives all zeroes and enables the circuit 100 (see FIG. 9) to generate the signal B/W in accordance with one-dimensional logic, that is to say, inverting the signal B/W after each run. The MUX-latch 81 (see FIG. 6) loads the counter 82 which, by way of the logic circuit 84, enables the register 83 to resume shifting and to shift out the least significant bit of the code used.

When the code represents any white run, as for the first run, or a black run less than seven, the circuit 85 (see FIG. 8) recognises at least one 1 in the three least significant bits, whereby it generates the bit A9=0. That causes the circuit 90 to generate the signal SD when the counter 82 returns to zero, thus stopping the shift of the code with the least significant bit at the end of the register 83 (see FIG. 6). That code can now be formed either by another code TC or a code MK. In the former case, relative decompression is effected in the manner described above. In the second situation, under the control of the timer 91, the length of the run is staticised in the latch circuit 92. It is then added in the counter 93 to the length given by the subsequent code, which is a TC, whereby the circuit 96 shifts out a number of bits equal to that sum.

If a code represents a run in which the three least significant bits are three zeroes, the circuit 85 (FIG. 8) on the one hand conditions the circuit 94 to examine the subsequent three bits and on the other hand the register 82 is registered with the length of the code increased by three and causes shift of the register 83 (FIG. 6) to continue, to shift out in each case the three least significant bits.

If the circuit 94 recognises at least one 1 in the three subsequent bits, the tenth bit of the address will be the bit A9=1. If however the circuit 94 recognises another three zeroes, the tenth bit A'9 of the address will be the thirteenth bit of the code, produced at the NAND gate 95.

In both cases, the address of the ROMs 78 and 79 (see FIG. 7), with the aid of the bit A9 or A'9, is always properly defined, whereby the circuits 81, 92 and 93 (see FIG. 6) receive the decompression data represented by the compressed code which is extracted in that way, without the possibility of confusion. For the codes MK which are common to the whites and to the blacks, the circuit 87 (see FIG. 8) which recognises the sequence of seven least significant 0 produces the signal A10=1 which permits addressing of the memories 78 and 79 in the region of said common codes MK. The colour however is defined by the subsequent code TC and thus controls the production by the circuit 96 of the decompressed bits corresponding to the two codes MK and TC. When one-dimensional coding is employed, the associated end-of-line code recognised by the circuit 89 excludes control of the preceding decompressed line (reference line), which is registered alternatively in the RAMs 71 and 72.

In general, the codes arriving at the register 83 may be both of one-dimensional and two-dimensional type. In the second case, the codes relating to the length of the runs are variably interleaved with the mode codes.

At that time, under the control of the associated end-of-line code, the register 104 is enabled progressively to pass to the logic circuit 103 the decompressed reference line which is already registered in one of the memories 71 and 72. When the register 83 addresses a mode code, the ROM 78 does not produce any output while the ROM 79 loads into the decoder 80 the three bits which define the mode corresponding to the code, which are staticised by the latch circuit 99 (see FIG. 9). It also loads into the MUX-latch 81 (see FIG. 6) the length of the code read, to preset expulsion thereof from the register 83. In that case, the circuit 100 (see FIG. 9) defines the colour fo the subsequent run in dependence on the mode code, as provided by the two-dimensional code.

From the comparison of the decoded mode and the reference line, the circuit 98 generates the instructions for the ouput circuit 96. In particular, if the latch circuit 99 has staticised the mode H, it sets the counter 101 in such a way as to condition, in combination with the signal B/W from the circuit 100, the output circuit 96 to produce the pulses provided by the subsequent two codes which represent the runs a0a1 and a1a2 (see FIG. 2b). If however the latch circuit 99 (see FIG. 9) has staticised the mode P, when the circuit 105 generates b2, the AND gate 109 outputs the signal FM which conditions the flip-flop 102 to stop the issue of the decompressed bits from the circuit 96, thus defining the run a0 a'0 (see FIG. 2a).

If the latch 99 (see FIG. 9) staticises one of the three modes VR, when the circuit 99 sets the flip-flop 102 it causes emission of the decompressed bits to begin, while when the circuit 105 generates the signal b1, the circuit 107 causes issue of the signal FM which resets the flip-flop 102, correspondingly stopping the issue of the decompressed bits by the circuit 96. Similarly, if the latch 99 staticises the mode V(O), the AND gate 108 immediately generates the signal FM, stopping issue of the bits. Finally, if the latch 99 staticises one of the modes VL, the flip-flop 102 is immediately set, initiating the issue of the decompressed bits. The circuit 106 then generates the signal FM after a corresponding number of clock pulses for resetting the flip-flop 102 and stopping the issue of the bits by the circuit 96. It will be clearly apparent from the foregoing that, both in the compression and in the decompression mode, each code has a single ROM access, whereby the associated decoding operation takes place at maximum speed. It will also be clear that, in the compression mode, three runs are processed simultaneously, one being present in the latch 61 (see FIG. 3), one coming from the register 37 and the third being that whose bits are being counted in the counter 36.

Finally, it will be clear that, in the decompression mode, two one-dimensional codes are processed simultaneously, even if they are in different phases. A first code is that whose decoding has been loaded into the counter 93 (see FIG. 6) and the other is that which is addressing the ROMs 78 and 79. The two phases are asynchronous and one thereof could even be omitted for certain codes (EOL, zero run length), whereby they would be processed more rapidly. In the case of two-dimensional codes, the control exerted by the counter 93 on the issue of the bits may be replaced by the control of the circuit 98, while the circuit 103 simultaneously deals with the decoding from the code of the previous line.

PROCESSING OF THE HALF TONE

Figures 10, 11, 12:
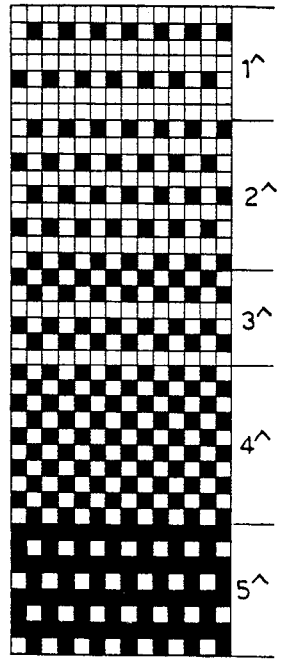
FIG. 10 shows the representation of some degrees of medium tones.
FIG. 11 shows the runs of the two types of medium tones.
FIG. 12 shows coding of the runs of the two types shown in FIG. 11.

As is known, in the digital processing of images, the half tone or greys are stored as an alternation, based on suitable matrixes, of black and white pixels. FIG. 10 shows by way of example five degrees of grey indicated by 1' to 5' which range from 25% of black at 1' to 75% of black at 5'. It can be easily seen that the various degrees are represented by a combination of completely white lines, completely black lines and lines formed by a succession of white and black pixels.

According to the invention, for the purpose of distinguishing between the black pixels, as between one line and the subsequent line, two series of codes are distinguished: one is represented by a succession which begins with a white pixel which will be referred to hereinafter as grey-white (GW) (FIG. 11) while the other is represented by a succession which begins with a black pixel which will be referred to hereinafter as grey-black (GB) (FIG. 11). Each series will always have a length or run given by an equal number of pixels.

The runs of the above-indicated types of grey GW and GB may be paired with the runs W and B respectively to construct two sets of terminating codes TC similar to the Huffman codes for the runs W and B, while for the codes MK of the two greys, it is possible to use the same for W and B respectively, leaving the code TC to distinguish between the two cases. Introducing the two greys does not permit automatic alternation of the colours, as in the case of B/W. In fact, the alternation situations may be ascertained from Table 2.

TABLE 2

| |
|---|
| 1 White - GB - white |
| 2 White - GB - black |
| 3 Black - GW - white |
| 4 Black - GW - black |
| 5 Black - GW - GB |
| 6 White - GB - GW |

Of the two alternations in each case shown in Table 2, the first alternation always denotes the transfer from a pixel of one colour to the opposite. In the second alternation, in cases 2 and 3, transfer from the grey takes place after a pixel of the same colour of the subsequent run. In order to be able to select the colour of the subsequent run, in the compression process a bit is coded in all the grey codes, this bit being referred to as TAG (see FIG. 7) which is 1 if the subsequent run is B or GB, whereas it is 0 if the subsequent run is W or GW. The preselected codes TC for the two types of grey are shown in FIG. 12 where the TAG is indicated by T. They enjoy the characteristic of Huffman codes, whereby no least significant part of one code is equal to another code. For the purposes of making the codes in FIG. 12 compatible with the codes TC for whites and blacks, slight modifications have been made in the standard Huffman codes TC for the white runs from 1 to 17 and 63 and those for the black runs 1, 8, 9 and 14. Coding in accordance with those codes which include processing of greys will be referred to hereinafter as 'non-standard coding' while coding of just the white and black pixels, as referred to in the previous sections of this text, which takes place in accordance with the proposed CCITT standard will be referred to as 'standard coding'.

For processing greys, the compression module 16 may include two ROMs 63' and 64' (FIG. 3) which are similar to the ROMs 63 and 64 but which carry the codes TC and MK modified as indicated hereinbefore in respect of the white and black runs and the codes GW and GB in FIG. 12 for the grey runs. SImilarly, in the decompression module 23, the group of ROMs 75 may include two ROMs 78' and 79' (see FIG. 6) which are similar to the ROMs 78 and 79 but which carry the decodings from the codes of the ROMs 63' and 64'. In practice, the compression process uses only two ROMs 63, 63' and 64, 64', each having a capacity of 2K bytes, while the decompression process uses only two ROMs 78, 78' and 79, 79', each with a capacity of 4K bytes. The two parts of each of the memories 63, 63', 64, 64', 78, 78' and 79, 79' are discriminated by a free address input and a free output respectively.

In the compression process, the above-mentioned free input receives a grey address code ADG (FIG. 5) which, together with the input B/W, suffices to discriminating all the possible cases, in accordance with Table 3.

TABLE 3

| ADG | W/B | CODE |
|-----|-----|-------|
| 0 | 0 | White |
| 0 | 1 | Black |
| 1 | 0 | GW |
| 1 | 1 | GB |

In addition, bearing in mind that the grey runs are intrinsically even in length, the least significant bit of the address, that is to say, of the binary number which is staticised in the latch 61 (see FIG. 3) is constant and can be suppressed. It is then substituted at the output of the ROMs 63, 63' and 64, 64' by the TAG bit which is introduced into the register 67 of the circuit 68.

In addition, to permit recognition of all the colour transitions, the logic circuit 35 of the compression module comprises a logic gate circuit 112 (see FIG. 13) which can recognise the transitions from white to black and viceversa, giving a signal W or B as described hereinbefore in regard to standard coding. Those signals provide control of a first flip-flop 113 which thus stores from time to time the colour W or B of the current run. The circuit 35 further comprises a logic gate circuit 114 for recognising the grey runs, which is also controlled by the circuit 33 (see FIG. 3) and is controlled by a non-standard coding selection instruction 116.

A flip-flop 117 which is controlled by the signals from the circuit 114 stores from time to time if the current run is a grey run. A third logic gate circuit 118 of the circuit 35 is conditioned by the circuit 112 to provide the white or black colour of the subsequent run, which is stored by a flip-flop 119. The logic circuit 118 is also conditioned by the circuit 114 to provide the grey colour of the subsequent run, which is stored by another flip-flop 120.

Now added to the formation of the ROM address effected by the circuit 59 are the run colour bits which are provided by the flip-flops 113 and 117 and the TAG bit which is provided by a circuit 121 controlled by the two flip-flops 113 and 117. In two-dimensional compression, the instruction 116 now conditions the circuit 41 (FIG. 3) in such a way that, each time that a grey occurs in the MUX 54 (FIG. 4), the mode H is produced, and there is disregard of the transitions b1 and b2 which would be verified for the alternations 01 and 10 in respect of the greys, thereby eliminating the correlations of the reference line which are generated by the greys. It will be clear therefore that the grey runs are compressed by the module 16 (see FIG. 1) substantially as occurred with runs of pixels of the same colour.

In the decompression process, the ROM 78, 78' (see FIG. 7) gives the information ADG at its one output G, while the ROM 79, 79' gives at another output the TAG which serves for addressing the subsequent code. In addition, the circuit 85 (see FIG. 8) recognises the three least significant bits of the GBs and causes shift of the register 83 (see FIG. 6) by three additional bits, as in the standard situation in respect of black runs, generating the tenth bit A9 of the address of the read only memories. The circuit 84 further comprises a logic gate circuit 123 which can be rendered active by the instruction 116, for recognising when the counter 82 is zeroed if the three least significant bits of the codes GW (FIG. 12) are 1. In the positive case, the circuit 123 produces a bit A''9=1 which constitutes the tenth bit of the address of the read only memories. The bit A''9 acts on the circuit 90 to cause it to produce the signal SD, whereby the register 83 (see FIG. 6) is also shifted by three added bits, suppressing the above-mentioned three bits=1.

In addition, under the control of the signals G and TAG of the memories 78—78' and 79—79', the circuit 100 (see FIG. 9) is capable of recognising the four colours. When it recognises the two greys, it conditions a circuit formed by a JK-flip-flop 122 to alternate the instruction of black and white for the output circuit 96 (see FIG. 6), whereby the half tone are also decompressed by the module 23 (see FIG. 1), as occurred with runs of a single colour.

TRANSMISSION OF IMAGES ON A FACSIMILE LINE

The CCITT standard G3 provides for two-dimensional coding as optional and does not provide for coding of greys. In the case of transmission on a facsimile line, if the apparatus at the receiving station does not provide for two-dimensional coding and/or grey coding, the transmitting station must relinquish same. On the other hand, since two-dimensional coding is better compressed in comparison with one-dimensional coding and coding of greys provides more complete information for the user devices which also print or display the medium tones, whenever the documents read by the unit 15 are to archive stored, it may be useful to record the more complete information with smaller occupation of the memory 17.

For the purposes of effecting single scanning of the document, both for standard one-dimensional or two-dimensional transmission or for archival storage with the half tone, a circuit 122 (see FIG. 9) may be disabled by means of an instruction HC for one-dimensional transmission, whereby the white/black alternations which are present in the matrices of the grey tones are replaced by runs which are entirely white or black. In particular, the code GW generates a white run while the code GB generates a black run.

In addition, the instruction HC can predispose a chain connection in respect of the modules 17, 23, 16 and 18 (see FIG. 1). In particular, the instruction HC connects the circuit 96 (see FIG. 6) of the module 23 to the circuit 33 (see FIG. 3) of the module 16 by way of the two interface units 20 (see FIG. 1) and the connecting cable 25.

To transmit on a facsimile line with one-dimensional codes, instructions are first produced for scanning, associated non-standard two-dimensional compression and archive storage of the document in the memory 17. Then, by means of the instruction HC, transmission is instructed, which takes place by way of the following real time operations with the archive in the memory 17:(1) decompression with transformation of the image with medium tones into white/black image in the module 23; (2) one-dimensional compression in the module 16; and (3) dispatch to the modem 18 for transmission on the facsimile line 19.

We claim:

1. A method for the compression and decompression of digital image information, for indicating at least two separate colors and an half tone color, wherein a code representing a run of pixels can be formed from pixels which are all of one or the other of two colors or from the half tone run formed by an alternation of pixels of the two colors, characterised in the coding is effected separately in respect to a first half-tone run which begins with one color and a second half-tone run which begins with the other color, wherey there are four different types of run.

2. A method according to claim 1 characterised in that the runs which are less in length than a certain value are represented in respect of each type by a series of codes having a variable number of bits, such that no least significant part of a code is a code of the series.

3. A method according to claim 2, characterised in that the half-tone runs are all of a length given by an even number of pixels, each half tone run being associated with the colour of the initial pixel of the run.

4. A method according to claim 3, wherein the half-tone pixels in subsequent lines are coded alternately according to said first half-tone run and to said second half-tone run, whereby the column of pixels are also represented by alternation of pixels of said two colors.

5. A method according to claim 3, wherein the first and second half-tone runs are codified with codes of the modified Huffman type.

6. A method according to claim 5, wherein the codes of said first and second half-tone runs terminate with a TAG bit indicating one of said two colors occurring in the following pixel run.

7. Apparatus for decompressing digital image information representing runs of pixels of variable length, which are coded with a code such that no least significant part of a code is itself a code, comprising a read only memory (75) for being addressed by the codes, characterized in that the memory (75) is addressed by a shift register (83) capable of serially receiving the bits of each code, the memory having a number of address inputs (A0–A10) less than the maximum number of bits of the code, logic means (84) being provided to recognize a group of least significant bits of a code to replace the same by a smaller number of address bits and to cause said shift register to be shifted by the number of bits of the code.

8. Apparatus according to claim 7, characterised in that the group of least significant bits are represented by at least three identical bits of the runs of a predetermrined type, the logic means replacing said three bits by a single address bit (A9, A'9 or A10).

9. An apparatus for compressing digital image information comprising a scanner for sequentially scanning the pixels of a line of the image, a current line shift register for receiving from said scanner the signals of the scanned pixels, a pair of read-write memory sections each one capable of temporarily storing at least the signals of one line of pixels, a reference line shift register for receiving the signals read out from said memory sections, read-write select means conditionable for connecting one memory section of said pair to said current line shift register to store the signals of the pixels of the current line and for simultaneously connecting the other memory section of said pair to said reference line shift register to load therein the signal read out from said other memory section, said read-write select means being conditioned at the end of the scanning of each line for alternating the connections of said pair of memory sections with said registers, compression selecting means operable for individually selecting a one-dimension compression of information according to the current line only and a two-dimension compression of information according to both the current line and the reference line, a read only memory carrying binary codes of the pixel runs of said one-dimension compression and of said two-dimension compression, address forming means jointly conditioned by said compression selecting means and by said memory sections for addressing said read only memory, and an output shift register for reading out the compression code addressed in said read only memory, whereby the bits of compression code are serially extracted therefrom.

10. An apparatus according to claim 9, wherein said address forming means comprises a run end detecting circuit, a counter zeroized by said circuit and conditioned by said current line shift register for counting the run pixel signals of the current line and a run addressed forming circuit conditioned by said counter for addressing said read only memory accordingly.

11. An apparatus according to claim 10, wherein said two-dimensional compression is selectable according to a group of different modes, said address forming means also comprising a logic circuit for defining the color transitions in the current line and in the reference line, a mode detecting circuit controlled by said logic circuit for selecting one of said group modes, and a mode address forming circuit conditioned by said mode detecting circuit for addressing said read only memory accordingly, said compression selecting means being operable for selecting said run address forming circuit and said mode address forming circuit for addressing said read only memory.

12. Apparatus according to claim 11, wherein said compression selecting means comprise parameter varying logic means whhich can be set in a condition on the basis of the definition of the pixels for periodically alternating the lines which are compressed on the basis of the addresses given by the said counter with those compressed on the basis of the addresses given by the mode address forming circuit.

13. An apparatus for decompressing digital image information comprising an output circuit conditionable for outputting the decompressed bits representing the image pixels, a pair of read-write memory sections each one capable of temporarily storing at least the bits of one line of pixels supplied by said output circuit, a reference line shift register for receiving the bits read out from said memory sections, read-write select means conditionable for connecting said output circuit to one memory section of said pair to store the bits of the pixels of the current line while being outputted and for simultaneously connecting said reference line shift register to the other memory section of said pair to load therein the bits read out from said other memory section, end of line decoding means for conditioning said read-write select means for alternating the connections of said pair of memory sections to said output circuit and to said reference line shift register, a read only memory storing the bits of the pixel runs at an address coresponding to compression codes, an input register for receiving said compression codes to address said read only memory, said compression codes also indicating one of a plurality of compression modes, said read only memory comprising a first section for supplying the information of the length of the decompressed pixel runs and a second section for supplying the information of the compression mode, the two sections of said read only memory being simultaneously addressed by said input register, first decoding means for decoding the information of the first section of said read only memory to so condition said output circuit, and second decoding means for decoding the information of the second section of said read only memory for additionally controlling said first decoder according to the content of said reference line shift register.

14. Apparatus according to claim 13, characterized in that the second section of the read only memory is capable of producing decoding of a compression code, comparison means being provided for comparing the decoding of the mode code to the reference line and consequently conditioning said output circuit for generating decompressed runs from the two-dimensional code.

15. An apparatus according to claim 13, wherein said compression codes are of the modified Huffman type, said input register being adapted to serially receive and shift said compressed codes, and including a logic circuit operative in response of the output of said read only memory for causing said input register to shift the compression code having addressed said read only memory.

16. An apparatus according to claim 15, wherein the second section of said read only memory also supplies information of the number of bits forming the decompressed code, said logic circuit being controlled by the counter loaded each time with said information of the number of bits.

17. Apparatus according to claim 13, wherein said read only memory has a number of input (A0–A10) lower than the maximum number of bits of said compression codes, said logic means comprising recognizing means for recognizing a group of least significant bits of a compression code to replace same by a smaller number of address bits (A9, A'9, A10) and to condition the logic means to cause additional shift (SD) of the said input register.

18. Apparatus according to claim 17, characterised in that each group of least significant bits include the least three indentical bits of the runs of a predetermined type, said logic means replacing the three bits by a single address bit.

19. An apparatus according to claim 18, wherein said recognizing means include a first recognizing circuit for recognizing said least three significant bits to define one of said address bits with a predetermined value, and a second recognizing circuit conditioned by said first recognizing circuit upon having recognized said least three identical bits for recognizing the subsequent least three identical bits of the run of said predetermined type to define said one bit of the address with another value.

20. Apparatus according to claim 13, wherein said output circuit is controlled by means for receiving the decoding information from said read only memory comprising a counter (93) for receiving the length of the run to be decompressed.

21. Apparatus according to claim 20, wherein the run lengths, if less than a predetermined length value, can be coded with a single code TC and, if greater than the said length, can be coded with a code MK associated with a whole multiple of the said value and added to a code TC, wherein said read only memory supplies to said output circuit information for indicating whether TC or MK are involved.

22. Apparatus according to claim 21, characterised by a latching circuit for latching the decoding of a code MK, and in that the counter sums the content of the latching circuit with the decoding of a subsequent code TC.

23. An apparatus for the compression of digital information indicating runs of pixels of at least two separate basic colors and a half-tone color represented by an alternation of pixels of said two basic colors, comprising a scanner for sequentially scanning the pixels of a line of image, basic color recognizing means for recognizing the basic color of the scanned pixels, compression coding means jointly controlled by said scanner and said color recognizing means for separately coding the runs of pixels of each one of said basic colors, half-tone recognizing means for recognizing the scanned half-tone colors, and transition defining means jointly controlled by said color recognizing means and said half-tone recognizing means for defining the color transitions of two types of half-tone runs beginning with the basic color opposite to the color of the previous basic color run, said compression coding means being also jointly controlled by said scanner and said transition defining means for separately coding the runs of said two half-tone colors.

24. Apparatus according to claim 23, wherein the compression coding means includes a read only memory carrying binary codes of the pixel runs, and address forming means controlled by said recognizing means and said transition defining means for addressing said read only memory, said read only memory comprising two portions, one for compression of runs of only said two basic colors and the other for compression of runs of said two basic colors and said two types of half-tone colors, selecting means being provided to enable said address forming means to address one or other of the two portions of said read only memory.

25. An apparatus according to claim 23, wherein said compression coding means include a read only memory carrying binary codes of the pixel runs of said two basic colors and of said two half-tone runs, and address forming means controlled by said recognizing means and said transition defining means for addressing said read only memory, and comprising an output register for temporarily storing the compression code addressed in said read only memory, and means for recognizing the color of a run subsequent to a half-tone run to alter in said output register the compression code read out from said second section according to the color of said subsequent run.

26. An apparatus according to claim 25, wherein siad decoding means includes a read only memory addressed by said input register, said read only memory including one portion for the decompression of codes of runs of only said two basic colors and another portion for the decompression of codes of runs of said two basic colors and of said two types of half-tone colors, selecting means being provided for causing said input register to address one of said two portions.

27. An apparatus for the decompression of compression codes of digital image information indicating runs of pixels of at least two separate basic colors and a half-tone color represented by an alternation of pixels of said two basic colors, said half-tone color being coded separately as a first type of half-tone run beginning with one basic color and a second type of half-tone run beginning with the other basic color, said compression codes including two dimensional compression codes selectable according to a group of different modes of compression comprising an input register for receiving the compression codes, decoding means for decoding the compressed code received by said input register, and output means for generating bits corresponding to the pixels of the decoded runs, said decoding means including a first section supplying the information of the length of the decompressed run of pixels and a second section for supplying further information of the basic colors of the pixels of the run subsequent to a half-tone run and the mode of compression, said first section also supplying information indicative of the half-tone run, and an output logic circuit responsive to said further information for additionally controlling the operation of said first section.

28. An apparatus according to claim 27, wherein said output logic includes color detecting means for detecting when a half-tone run is decoded, and color alternating means for controlling the alternation of said basic colors when one of said type of half-tone runs is detected.

29. An image information compressing and decompressing apparatus comprising a compression module selectively operable for compressing the image information according to a one-dimension code and to a two-dimension code, a decompression module operable for decompressing an image information compressed according to said one-dimension and said two-dimension code, a mass memory for archival storage of image information compressed according to said two-dimension code, an image transmission unit for transmitting image information compressed according to said one-dimension code only, control means for connecting said decompression module to said mass memory and for conditioning said decompression module for operation, means for connecting said compression module to said transmission unit, and means for connecting said decompression module to said compression module and for causing said compression module to decompress the image information decompressed by said decompression module according to said one-dimension code.

* * * * *